United States Patent
Joos et al.

(10) Patent No.: US 11,112,303 B2
(45) Date of Patent: Sep. 7, 2021

(54) MEASUREMENT CIRCUIT AND METHOD THEREFOR

(71) Applicant: SEMICONDUCTOR COMPONENTS INDUSTRIES, LLC, Phoenix, AZ (US)

(72) Inventors: Dieter Jozef Joos, Nieuwenrode (BE); Thomas Sevrin, Jemeppe-sur-Sambre (BE); Patrick Lepers, Céroux-Mousty (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 225 days.

(21) Appl. No.: 16/410,320

(22) Filed: May 13, 2019

(65) Prior Publication Data

US 2020/0264040 A1   Aug. 20, 2020

Related U.S. Application Data

(60) Provisional application No. 62/806,446, filed on Feb. 15, 2019.

(51) Int. Cl.
*G01J 1/44* (2006.01)
*H03F 3/45* (2006.01)

(52) U.S. Cl.
CPC ............ *G01J 1/44* (2013.01); *H03F 3/45071* (2013.01); *H03F 2200/129* (2013.01); *H03F 2203/45116* (2013.01); *H03F 2203/45526* (2013.01)

(58) Field of Classification Search
CPC .......... G01J 1/44; G01J 1/46; H03F 3/45071; H03F 2203/45526; H03F 2203/45116; H03F 2200/129; H03F 2203/45616; H03F 3/087; H03F 3/45475
See application file for complete search history.

(56) References Cited

U.S. PATENT DOCUMENTS

| | | | |
|---|---|---|---|
| 4,713,534 A * | 12/1987 | Masters | H03K 17/941 250/214 B |
| 7,136,000 B1 | 11/2006 | Hidri et al. | |
| 2003/0218508 A1 | 11/2003 | Chiou et al. | |
| 2016/0380595 A1 * | 12/2016 | Finlinson | A61B 5/02416 600/479 |

* cited by examiner

*Primary Examiner* — Thanh Luu
*Assistant Examiner* — Monica T Taba
(74) *Attorney, Agent, or Firm* — Robert F. Hightower

(57) ABSTRACT

In embodiment, a measurement circuit forms a compensation signal that is representative of disturbances that are received while the measurement circuit is not receiving a signal to be measured, then the circuit removes the compensation signal from the measurement signal before measuring the value of the measurement signal.

20 Claims, 6 Drawing Sheets

MEASUREMENT CIRCUIT AND METHOD THEREFOR

PRIORITY CLAIM TO PRIOR PROVISIONAL FILING

This application claims priority to prior filed Provisional Application No. 62/806,446 entitled "TRACK AND HOLD SYSTEM" filed on Feb. 15, 2019, and having common inventors Joos et al. which is hereby incorporated herein by reference

BACKGROUND OF THE INVENTION

The present invention relates, in general, to electronics, and more particularly, to semiconductors, structures thereof, and methods of forming semiconductor devices.

In the past, the semiconductor industry utilized various circuits and methods to measure signals that were received from other sources. For example, the signal to be measured might come from a detector that detects light emitted by source such as for example a light emitting diode (LED). In some applications, the received signal to be measured might also include various noise signals including noise induced by ambient light and/or by other environmental sources. The noise portion of the received signal may include signals that varied at various frequencies.

Some circuits tried to remove the noise using track and hold systems. However, some of the systems could not remove the noise and also provide stable operation of the system. In other systems, the operation to sample the signal often introduced additional errors or errors could also be introduced during the transition from tracking to holding.

Accordingly, it is desirable to have a measurement system that can reduce the noise signals, that can provide more stable operation, and/or that can reduce induced errors.

Figure 1:
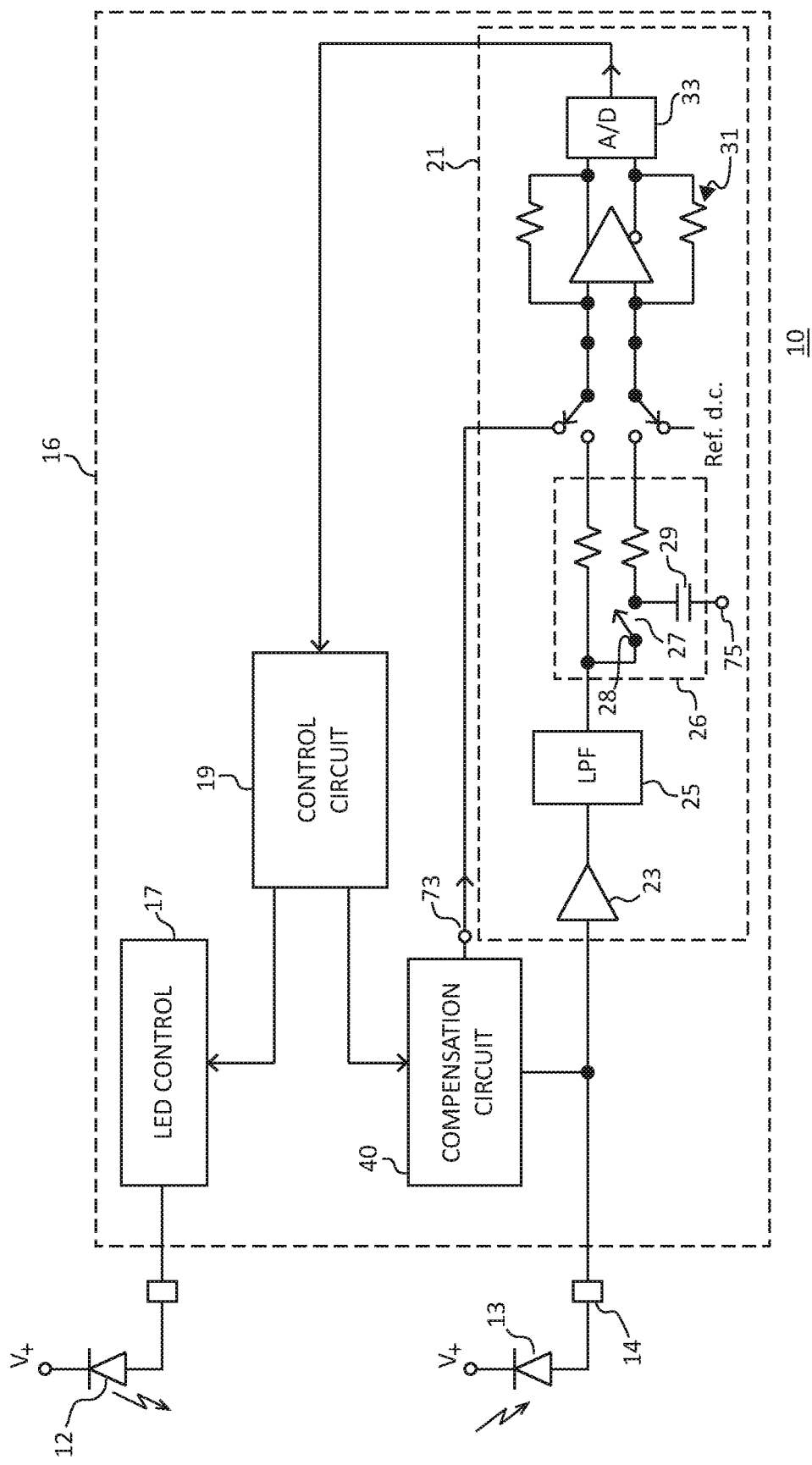
FIG. 1 schematically illustrates an example of an embodiment of a portion of a measurement system in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates an example of an embodiment of a portion of a measurement system 10. System 10 is configured to receive an input signal on input 14. The input signal may include a signal to be measured or a measurement signal. System 10 includes a measurement circuit 16 that is configured to, among other things, measure a value of the measurement signal and can provide improved operation for system 10. An embodiment of circuit 16 may provide an improved dynamic range for system 10.

Circuit 16 may have an embodiment that may be configured to receive the input signal and measure a value of the measurement signal. In an example embodiment, circuit 16 may be configured to be coupled to an LED 12, and to energize LED 12 to emit light. Circuit 16 may have an embodiment that includes an LED control circuit 17 that may be configured to control the operation of LED 12. Circuit 16 includes a measurement channel circuit 21 that is configured to receive the input signal from input 14 and measure a value of the measurement signal. An embodiment of circuit 21 may include a transimpedance amplifier 23, a low pass filter 25, a sample-and-hold circuit 26, and a programmable gain amplifier 31. Circuit 21 may also have an embodiment that includes an analog-to-digital converter 33.

The input signal received by circuit 16 may include disturbance signals or disturbances in the input signal in addition to the measurement signal. Circuit 16 includes a compensation circuit 40 that is configured to assist in reducing the disturbances in the input signal that is received along with the measurement signal on input 14. The disturbances may, in an embodiment, include signals formed by ambient light and/or by other environmental sources. In some embodiments, the disturbances may be much larger in value than the measurement signal. For example, the disturbances may be multiple decades larger than the measurement signal. In some embodiments, the input signal may also have other variations such as those induced by electromagnetic interference (EMI). An embodiment may include that the disturbances may have a.c. components with frequencies of up to one hundred (100) KHz or alternately frequencies less than approximately one MHz. The a.c. component may have other frequencies in other embodiments. The disturbances may also have d.c. components that vary in value with different slew rates. For example, the slew rate may include slopes of up to six hundred micro-amps per one hundred fifty micro-seconds (600 μA/150 μSec). The slew rate may have other values in other embodiments. The variations may an a.c. component that has frequencies greater than approximately one Mhz.

In an embodiment, circuit 40 may form an optional output signal on an optional output 73 that may optionally be used by circuit 21.

In general, circuit 16 may be configured to periodically energize LED 12 to emit light which may be received by photo-diode 13. Photo-diode 13 receives light from LED 12 and generates a measurement signal that is applied to input 14. Measurement channel circuit 21 is configured to receive the input signal including the measurement signal and measure the value thereof. During a time that circuit 16 is not energizing LED 12, the disturbances are still received on input 14 as the input signal. Compensation circuit 40 is configured to form a compensation signal that is representative of the disturbances. When LED 12 is emitting light, circuit 40 uses the compensation signal to reduce the amount of the disturbances that are included within the received measurement signal thereby improving the accuracy of the measurement performed by circuit 21. Those skilled in the art will appreciate that diode 13 conducts current through diode 13 when it receives light from LED 12 or from other sources. Input 14 may receive the current from diode 13 or input 14 may receive a voltage that is representative of the current.

As will be seen further hereinafter, circuit 40 may have an embodiment that may be configured to regulate input 14 to a value, such as for example a value representative of a reference signal, for a first time interval while circuit 40 (or alternately circuit 21) is not receiving the measurement signal, but is receiving the input signal from input 14. For example, the first time interval may be a time in which circuit 16 is not energizing LED 12 to generate light. Such an embodiment of circuit 40 may be configured to filter the input signal during a portion of this first time interval and to also gradually decrease a cut-off frequency of the filter during this portion of the first time interval. For example, circuit 40 may also be configured to vary the impedance of an element of the filter to decrease the cut-off frequency. Circuit 40 may also be configured to apply a signal representative of the filtered signal to input 14 for a second time interval while circuit 40 is not regulating input 14 but while input 14 is receiving the measurement signal, such as the measurement signal received by photo-diode 13 (for example, while circuit 16 is energizing LED 12). Amplifier 23 may have an embodiment that regulates input 14 during this second time interval. Applying this signal (from circuit 40) to input 14 while input 14 is receiving the measurement signal assists in removing the disturbances from the measurement signal thereby allowing circuit 21 to more accurately measure the value of the measurement signal. For example, circuit 40 applying the signal to input 14 may reduce the dynamic range over which circuit 21 has to operate in order to measure the measurement signal.

Figure 2:
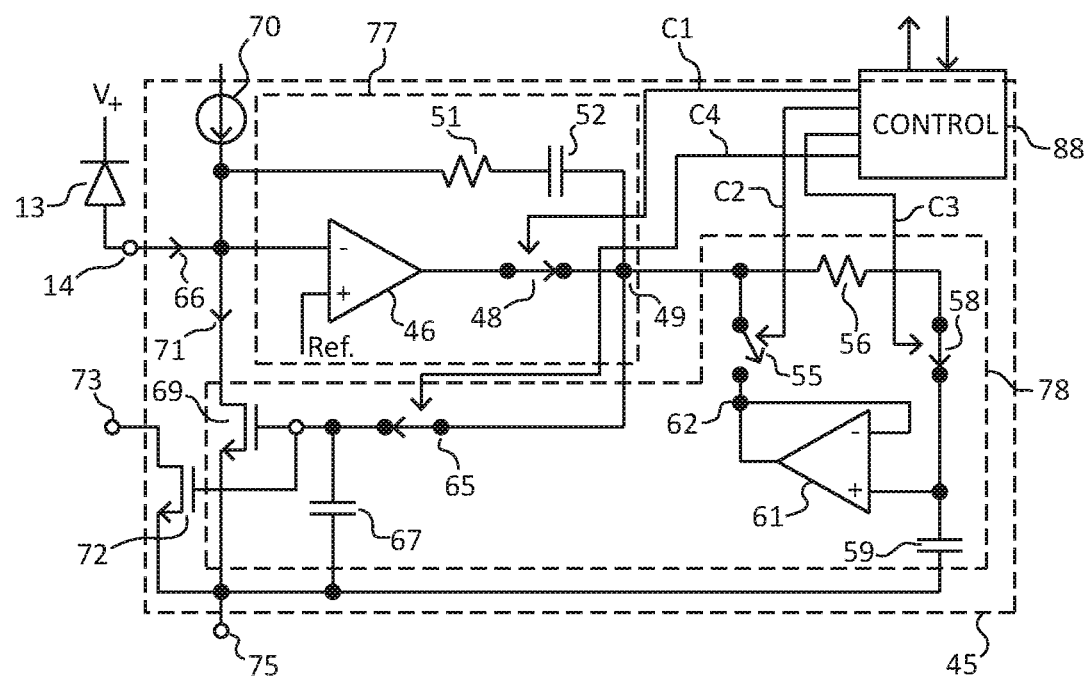
FIG. 2 schematically illustrates an example of an embodiment of a portion of a compensation circuit that may have an embodiment that is an alternate embodiment of some of the circuits of FIG. 1 in accordance with the present invention.
Figure 4:
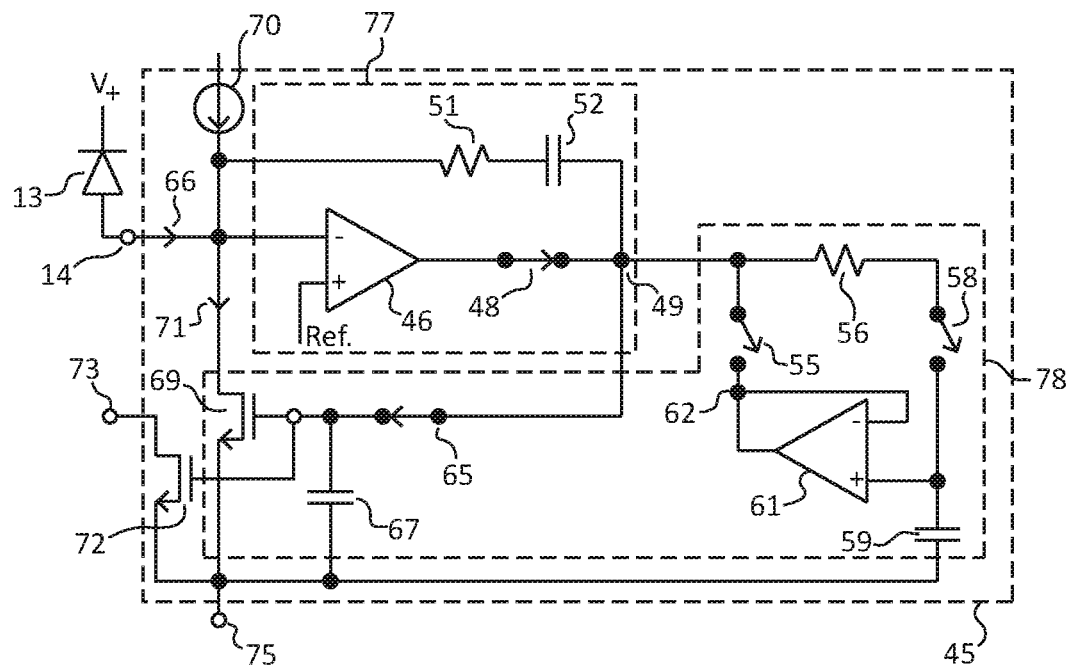
FIG. 4 illustrates an example of an embodiment of a configuration of the circuit of FIG. 2 during an operational state in accordance with the present invention.
Figure 5:
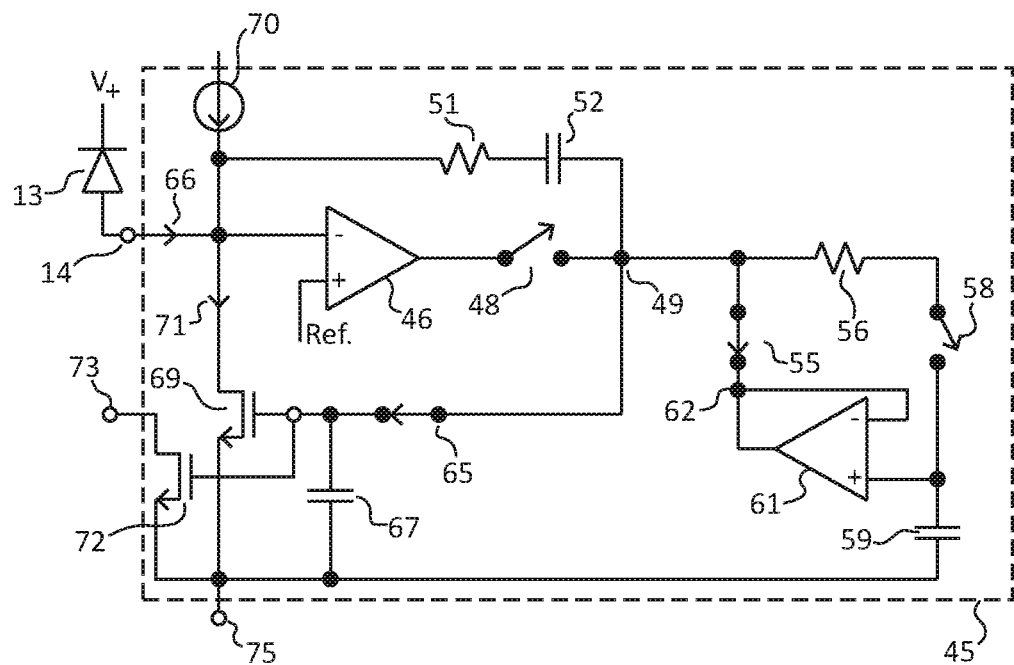
FIG. 5 illustrates an example of an embodiment of a configuration of the circuit of FIG. 2 during another operational state in accordance with the present invention.
Figure 6:
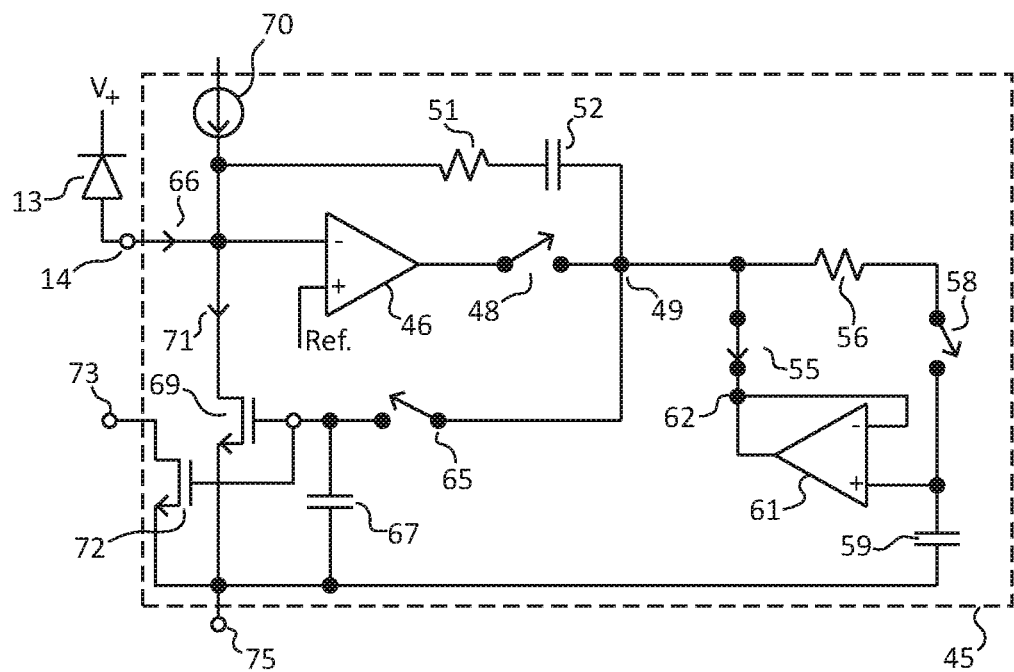
FIG. 6 illustrates an example embodiment of a configuration of the circuit of FIG. 2 during operation in yet another operational state in accordance with the present invention.

FIG. 2 schematically illustrates an example of an embodiment of a portion of a compensation circuit 45 that may have an embodiment that is an alternate embodiment of circuit 40 in FIG. 1. Circuit 45 is configured to selectively operate in four different operational states or phases that selectively change the operational configuration of circuit 45. The configuration illustrated in FIG. 2 illustrates a first particular state or first operational phase or phase one of circuit 45. Other operational states or phases are illustrated in FIGS. 4-6.

Circuit 45 includes a regulation circuit 77 and a sampling circuit 78. Circuit 77 may have an embodiment that includes a reference signal (Ref.), an amplifier 46, a switch 48, a capacitor 52, and a resistor 51. As will be seen further hereinafter, circuit 77 has a configuration in which circuit 77 regulates input 14. Circuit 78 may have an embodiment that includes a filter which may include a resistor 56, a series connected variable impedance switch or variable impedance circuit 58, and a series connected capacitor 59. Circuit 78 may also include a switch 55, a switch 65, a capacitor 67, a transistor 69, a buffer circuit, such as for example an amplifier 61, and an optional transistor 72 that may be connected to optional output 73. A current source 70 may be included in an embodiment of circuit 45.

An embodiment of circuit 45 may also include a control circuit 88 that forms control signals C1, C2, C3, and C4 to control the phases of circuit 45. Signals C1-C4 may have an embodiment that controls the operation of respective switches 48, 55, 58, and 65. Circuit 88 may also have an embodiment that receives a control signal from control circuit 19 (FIG. 1) and provides another control signal back to circuit 19 to synchronize the operation of circuit 45 with the operation of circuits 17 and 21 (FIG. 1). An embodiment may include that a portion of or all of circuit 88 may be included within circuit 19 (FIG. 1) and those signals are synchronized. For example, signals C1-C4 may come from circuit 19.

Figure 3:
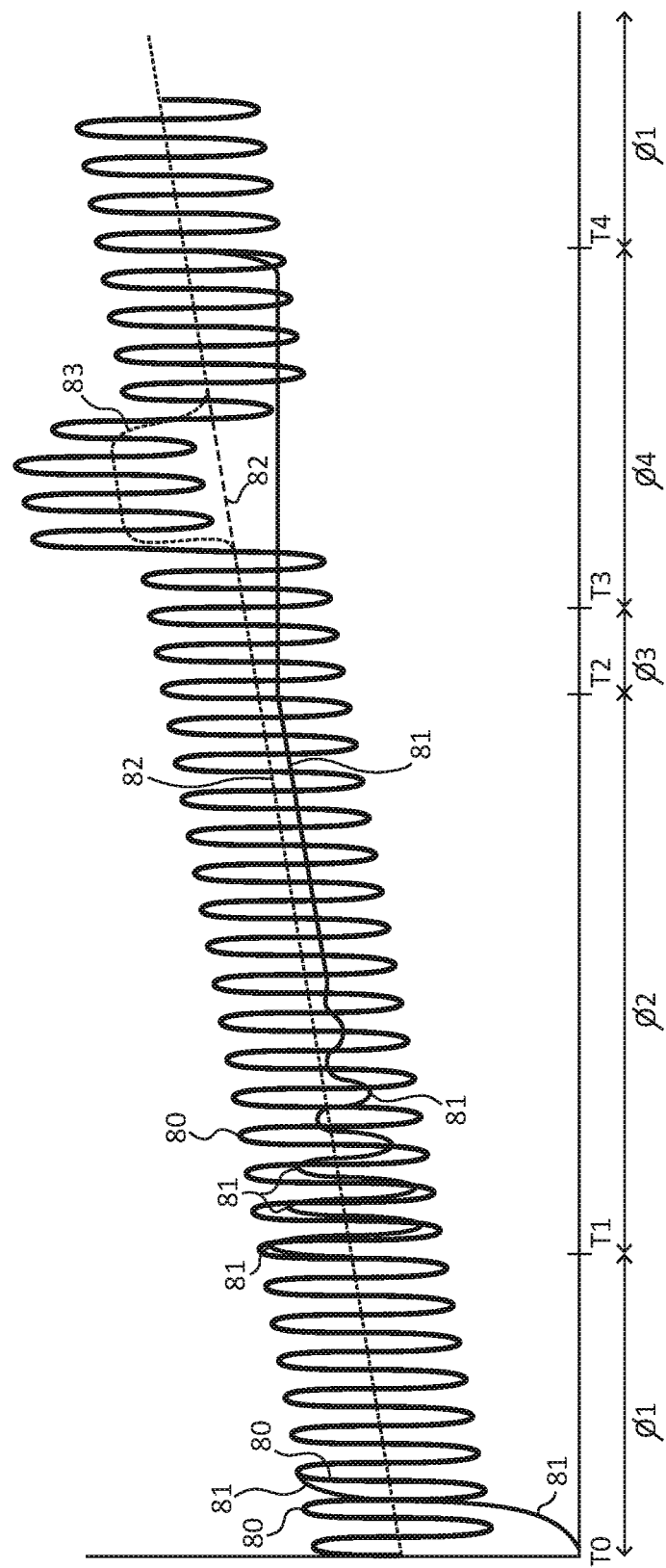
FIG. 3 is a graph having plots that illustrate in a general manner some of the signals formed by the circuit of FIGS. 1-2 during some of the operation thereof in accordance with the present invention.

FIG. 3 is a graph having plots that illustrate in a general manner some of the signals formed by circuit 45 during some of the operation of circuit 45. The abscissa indicates time and the ordinate indicates increasing value of the illustrated signal. A plot 80 illustrates in general the input signal received on input 14 and a plot 81 illustrates in general the signal received by capacitor 59 or alternately the signal stored on capacitor 59 or alternately a signal that is representative of the compensation signal applied to input 14. A signal 82, illustrated by a dashed line, is generally representative of the ambient light portion of the input signal, and a signal 83, illustrated by a dashed line, illustrates in general the measurement signal portion of the input signal. The time interval T0 to T1 illustrates the time interval in which circuit 45 operates in phase one, the time interval T1 to T2 illustrates the time interval in which circuit 45 operates in phase two, the time interval T2 to T3 illustrates the time interval in which circuit 45 operates in phase three, and the time interval T3 to T4 illustrates the time interval in which circuit 45 operates in phase four. The following descriptions have references to FIG. 3 in addition to FIGS. 2 and 4-6.

Referring to FIGS. 2-3, circuit 77 is configured to selectively regulate input 14 to a first value during a first time interval. In an embodiment, input 14 is not receiving the measurement signal during the first time interval, and LED 12 is not energized to emit light. In an example embodiment, circuit 16 (FIG. 1) is not energizing LED 12 during the first time interval. A first portion of the first time interval may be referred to as the phase one state or phase one operational condition of circuit 45 or alternately may be referred to as phase one.

During phase one, LED 12 is not energized to emit light. However, the input signal may be responsive to the disturbances, such as for example ambient light, received from a source external to circuit 45. During phase one, the input signal may be a substantially steady d.c. signal or may have a value that varies in response to the disturbances or the other variations. However, it is desirable to regulate input 14 to a substantially constant value in response to at least the disturbances. As explained hereinbefore, circuit 77 may be configured to regulate input 14 during phase one. Circuit 45 is configured to selectively close switch 48 such that amplifier 46, resistor 51, and capacitor 52 form a regulation loop that regulates input 14. For example, amplifier 46 may receive the input signal from input 14 and the reference signal (Ref.) and regulate input 14 to a value that is representative of the reference signal. In some embodiments, the input signal may be a current, such as for example a current 66 from diode 13. In such an embodiment, transistor 69 is controlled to sink a current 71 in order to regulate the signal on input 14 to substantially the value that is representative of the reference signal (Ref.). In some embodiments, transistor 69 may operate as a voltage controlled current source. Also during phase one, circuit 58 is selectively closed such that circuit 58, resistor 56, and capacitor 59 form a filter circuit that filters the output of amplifier 46. An embodiment of the filter circuit may, during phase one, have a pole that is high enough to allow the regulation loop of circuit 77 to track changes in the input signal such as those caused by the disturbances as illustrated in a general manner by plot 80. Switch 55 is open and switch 65 is closed. During phase one, transistor 69 is enabled to sink a current 71 from source 70 to assist in regulating input 14. For example, if the input signal is a current and if input 14 is not receiving a signal, transistor 69 may be controlled by the regulation loop to sink current 71 from source 70. In other embodiments, source 70 may be omitted. For example, the input signal may be a voltage. Those skilled in the art will appreciate that the regulation loop, formed by amplifier 46 and the feedback circuit of resistor 51 and capacitor 59 (when switch 48 is closed) and alternately transistor 69, should have a very fast response time in order to respond to changes in the value of the input signal received on input 14 during any time that the regulation loop is regulating input 14. Plot 80 illustrates between time T0 and T1 that input 14 receives the input signal and the signal on capacitor 59 is tracking the input signal as illustrated in a general manner by plot 81. An embodiment may include that capacitor 59 may store a voltage that is representative of the input signal. In an embodiment, the voltage on capacitor 59 may be representative of the control signal on the gate of transistor 69. Transistor 69 forms the compensation signal, such as for example current 71, that is representative of the input signal, such as for example current 66. Thus, the voltage on capacitor 59 may be representative of the compensation signal.

Figure 7:
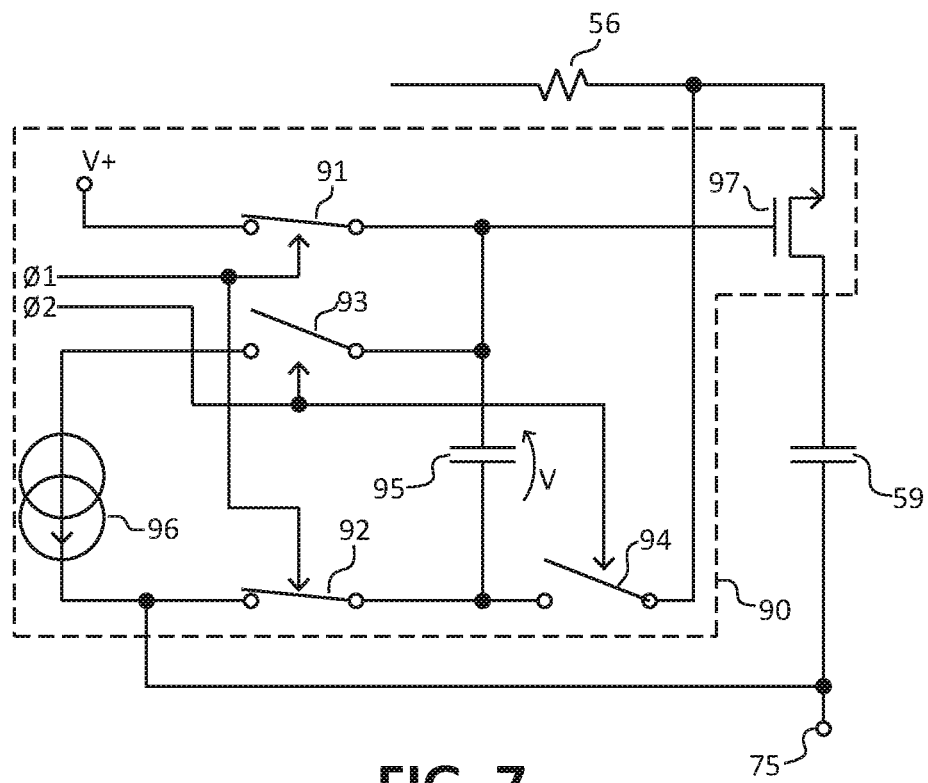
FIG. 7 schematically illustrates an example of an embodiment of a portion of a variable impedance circuit that may have an embodiment that is an alternate embodiment of some of the circuits of FIGS. 2 and 4-6 in accordance with the present invention.

FIG. 4 illustrates an example of an embodiment of a configuration of circuit 45 during operation in phase two, or alternately the phase two state of circuit 45. In an embodiment, phase two is part of the first time interval during which circuit 77 receives the input signal and regulates input 14 to the first value, such as for example to substantially the reference voltage, and during which LED 12 is not energized to emit light. During phase two, circuit 78 forms a sample signal that can be used to form the compensation signal that may be used to adjust a value of the measurement signal. For example, circuit 78 may form the sample signal on capacitor 59 or alternately across or alternately stored on capacitor 59. An embodiment of circuit 78 may be configured to slowly vary the cut-off frequency of the filter wherein the cut-off frequency is varied over a number of periods of the input signal. For example, circuit 78 may be configured to slowly vary the impedance of circuit 58 wherein the impedance is varied over the number of periods of the input signal. In an embodiment, the input signal may have perturbations that are the result of the disturbances or of the other variations (such as EMI as explained hereinbefore). The number of periods includes periods of these other variations. Circuit 78 may have an embodiment that increases the impedance of circuit 58 in order to vary the cut-off frequency. In other embodiments, circuit 78 may be configured to decrease the impedance of circuit 58 in order to vary the cut-off frequency. For example, circuit 78 may be configured to vary the impedance from a value of a few ohms to a value of substantially infinity wherein the varying occurs slowly over several periods of the input signal. An embodiment may include that varying the impedance of circuit 58 varies the cut-off frequency of the filter that includes circuit 58. For example, an embodiment of circuit 58 may be configured to reduce the cut-off frequency from approximately fifteen MHz to approximately zero Hz or alternately to substantially dc. An embodiment of an example of a portion of a variable impedance circuit is illustrated in FIG. 7. Plot 80 (FIG. 3) illustrates varying the impedance over least five periods of the input signal. In other embodiments the impedance may vary over an interval of at least three periods to at an interval of at least ten periods of the input signal. In other embodiments, the impedance may be varied over multiple periods of a lowest frequency that is expected to be received in the input signal, or alternately a lowest frequency to be filtered by the filter of circuit 78. In one embodiment the lowest frequency may be approximately one MHz. Alternately, the impedance may be varied over a specific time interval such as a time interval anywhere between approximately five microseconds to approximately ten microseconds.

The peak to peak swing of the input signal may be large as is illustrated by plot 80. It is more desirable to determine the average value of the input signal instead of using the peak to peak value. For example, the peak-to-peak swing may result from the other variations, such as EMI as explained hereinbefore, which should not be included in the signal stored on capacitor 59. It has been found that this assists in reducing the sampling error of circuit 21. Varying the impedance of circuit 58 gradually moves the pole of the filter during the time interval that the impedance of circuit 58 is varied which results in storing the average value of the input signal on capacitor 59 as is illustrated by plot 81. Plot 81 illustrates that the value of the signal stored on capacitor 59 may slowly change during phase two. For example, at the end of phase 2, the stored value may be approximately the average value of the input signal over the time interval that the cut-off frequency changes.

FIG. 5 illustrates an example embodiment of a configuration circuit 45 during operation in phase three, or alternately the phase three state of circuit 45. In an embodiment, phase three is part of the second time interval during which circuit 77 does not regulate input 14. Additionally, during phase three, diode 13 is not receiving the measurement signal, for example, circuit 16 (FIG. 1) is not driving LED 12 to emit light. In response to operating in phase three, circuit 45, or alternately circuit 77, is configured to be decoupled from regulating input 14. For example, circuit 45 may be configured to selectively open switch 48 to decouple circuit 45, or alternately circuit 77, from regulating input 14. In an embodiment of circuit 46, during phase 3 the input signal does not affect the compensation signal. During phase two, circuit 45 controlled circuit 58 to an open state. This open state also decouples capacitor 59 from receiving the input signal. Circuit 45 is also configured to selectively close switch 55 to transfer the value of the sample signal from capacitor 59 through amplifier 61 and switches 55 and 65 to capacitor 67. Those skilled in the art will understand that switch 55 is closed substantially simultaneously with opening switch 48 in order to prove continuity in the gate-to-source voltage for transistor 69. In an embodiment, amplifier 61 may be an auto-zero amplifier so that amplifier 61 does not introduce an offset in the signal that is transferred from capacitor 59 to capacitor 67. Because switches 55 and 65 are closed, transistor 69 begins to apply the compensation signal to input 14. For example, the voltage stored on capacitor 67 enables transistor 69 to apply the compensation signal to input 14 wherein the compensation signal is representative of the sample signal. For example, transistor 69 may be controlled to sink current 71. In an embodiment, the compensation signal is representative of the average value of the input signal received during phase two.

FIG. 6 illustrates an example embodiment of a configuration of circuit 45 during operation in phase four, or alternately the phase four state of circuit 45. In an embodiment, phase four is part of the second time interval during which circuit 77 does not regulate input 14. However, during phase four LED 12 is emitting light and diode 13 is forming the measurement signal that is representative of light received from LED 12. Input 14 receives the measurement signal and the disturbances and may also receive the other variations. The light from LED 12 increases the value of the input signal as illustrated by plots 80 and 83 after T3.

In response to operating in phase four, circuit 45 selectively opens switch 65 to maintain the sample signal transferred to capacitor 67. Circuit 45 subtracts the compensation signal from the received measurement signal to form a compensated measurement signal. Because the compensation signal is representative of at least the disturbances of the input signal, circuit 45 removes some of the disturbances from the measurement signal to form the compensated measurement signal that is representative of the light received from LED 12 without the unwanted disturbances. Consequently, measurement channel circuit 21 (FIG. 1) receives the compensated measurement signal from which the compensation signal has been removed. Therefore, circuit 21 more accurately measures the value of the portion of the light that is emitted by LED 12 and is received by diode 13. Additionally, signal 73 optionally may be used for a brief portion of phase 4 to assist circuit 21 in estimating a value of the ambient light received by diode 13.

Connecting the regulation loop substantially in parallel to the sampling circuit allows forming the compensation circuit to lower the cut-off frequency of the filter of sampling circuit 78 without affecting the stability of the regulation loop of circuit 77. The parallel configuration may also allow the compensation circuit to have a fast regulation loop that assists in improving the dynamic range of circuit 21. Forming the compensation circuit to gradually lower the cutoff frequency facilitates forming the average value of the input signal without the average value being disturbed by the other variations, such as those formed by EMI.

FIG. 7 schematically illustrates an example of an embodiment of a portion of a variable impedance circuit 90 that may have an embodiment that is an alternate embodiment of circuit 58 in FIGS. 2 and 4-6. Circuit 90 includes a current source 96, a capacitor 95, a transistor 97, switches 91 and 92 that are closed during phase one and open during phase two, and switches 93 and 94 that are open during phase one and closed during phase two.

During phase one, capacitor 95 is charged to a voltage V+. In some embodiments, the voltage V+ may be the operating power supply voltage. For example, capacitor 95 may be charged between a power supply voltage, such as V+, and the common reference received on input 75. In some embodiments, the voltage V+ may be referred to as Vcc. Input 75 is generally connected to a common return value such as for example a ground return value. During phase two, the bottom plate of capacitor 95 is coupled to the source of transistor 97 through switch 94, and the top plate of capacitor 95 is discharged by current source 96 through switch 93. Therefore, the voltage on the gate of transistor 97 is slowly decreased thereby slowly decreasing the gate-to-source voltage of transistor 97. As the gate-to-source voltage decreases, the on-resistance increases. When capacitor 95 becomes substantially discharged, the gate-to-source voltage of transistor 97 approaches zero which substantially shuts off transistor 97. Thus, circuit 90 gradually increases the impedance of transistor 97.

Figure 8:
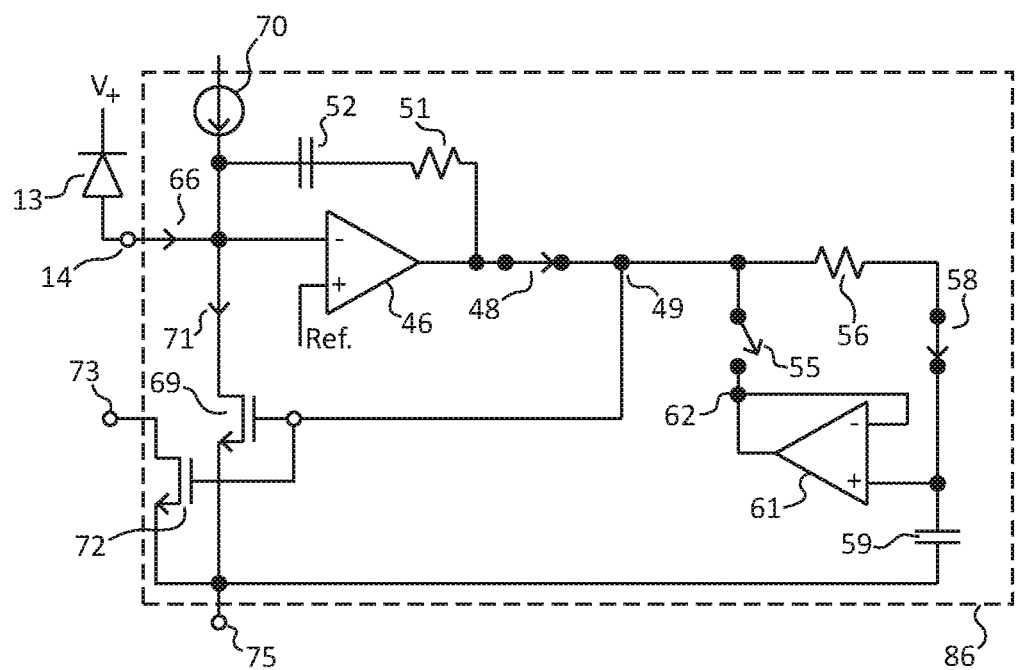
FIG. 8 schematically illustrates an example of an embodiment of a portion of a compensation circuit that may have an embodiment that is an alternate embodiment of one or more of the circuits of FIGS. 2 and 4-6 in accordance with the present invention.

FIG. 8 schematically illustrates an example of an embodiment of a portion of a compensation circuit 86 that may have an embodiment that is an alternate embodiment of circuit 45 in FIGS. 2 and 4-6. Circuit 86 is substantially the same as circuit 45 except that switch 65 is removed and replaced by a short circuit, and the feedback circuit of resistor 51 and capacitor 52 is connected directly to the output of amplifier 46 instead of to node 49. Also, capacitor 67 is removed. Additionally, circuit 86 is configured to selectively operate in three different operational states or phases that selectively changes the operational configuration of circuit 86, instead of the four phases of circuit 45. Phases one, two, and three of circuit 86 operate the same as phases one, two, and three of circuit 45. Thus, circuit 86 regulates input 14 during phase one and phase two. During phase two, circuit 86 gradually reduces the cut-off frequency of circuit 58 which is substantially the same as the operation of circuit 45. Also, during phase three, LED 12 emits light and input 14 receives the measurement signal so that circuit 86 may apply the compensation signal to input 14. Circuit 86 does not operate in a phase four configuration. An embodiment of circuit 86 may include that amplifier 61 is an auto-zero amplifier that is substantially stable during phase three.

Those skilled in the art will appreciate that an embodiment of circuit 45 may include that input 14 is configured to be commonly connected to the anode of diode 13, an inverting input of amplifier 46, a drain of transistor 69, a first terminal of resistor 51, and a first terminal of current source 70. A non-inverting input of amplifier 46 is connected to receive the reference voltage (Ref.). An output of amplifier 46 is connected to a first terminal of switch 48. A second terminal of switch 48 is commonly connected to node 49, a first terminal of switch 55, a first terminal of resistor 56, a first terminal of switch 65, and a first terminal of capacitor 52. A second terminal of capacitor 52 is connected to a second terminal of resistor 51. A second terminal of switch 65 is commonly connected to a gate of transistor 69, a gate of transistor 72, and a first terminal of capacitor 67. A second terminal of capacitor 67 is commonly connected to a source of transistor 69, a source of transistor 72, a first terminal of capacitor 59, and input 75. A drain of transistor 72 is connected to output 73. A second terminal of capacitor 59 is commonly connected to a non-inverting input of amplifier 61 and a first terminal of switch 58. A second terminal of switch 58 is connected to a second terminal of resistor 56. An inverting input of amplifier 61 is commonly connected to node 62, an output of amplifier 61, and a second terminal of switch 55. A control terminal of switch 48 is connected to receive control signal C1, a control terminal of switch 55 is connected to receive control signal C2, a control terminal of switch 58 is connected to receive control signal C3, and a control terminal of switch 65 is connected to receive control signal C4.

Figure 9:
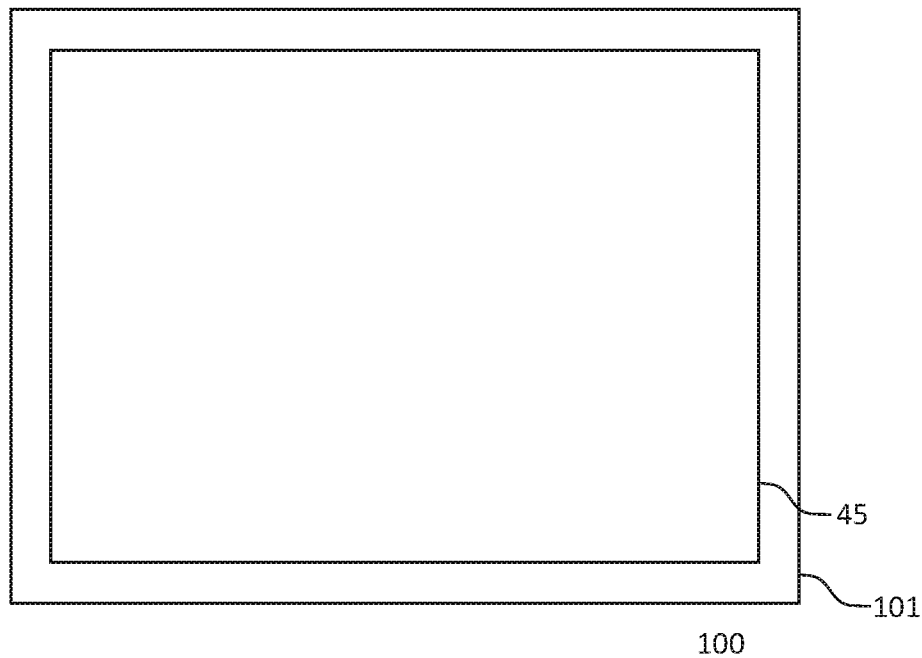
FIG. 9 illustrates an enlarged plan view of a semiconductor device that includes the circuits of FIGS. 1-2 and 4-8 in accordance with the present invention.

FIG. 9 illustrates an enlarged plan view of a portion of an embodiment of a semiconductor device or integrated circuit 100 that is formed on a semiconductor die 101. In an embodiment, any one of circuits 16, or 40 or 45, or 86 may be formed on die 101. Die 101 may also include other circuits that are not shown in FIG. 9 for simplicity of the drawing. The circuits or integrated circuit 100 may be formed on die 101 by semiconductor manufacturing techniques that are well known to those skilled in the art.

From all the foregoing, one skilled in the art will understand that an example of an embodiment of a measurement circuit may comprise:

a measurement channel circuit, such as for example circuit 21, configured to receive an input signal, such as for example of the signal on input 14, from an input, such as for example input 14, of the measurement circuit and measure a value of the input signal;

a regulation circuit, such as for example circuit 77, having a first switch, such as for example switch 48, configured to selectively couple the regulation circuit to regulate the input to a first value, such as for example the Ref. value, during a first time interval, such as for example the interval of phase one and phase two, and to selectively decouple the regulation circuit from regulating the input during a second time interval, such as for example the interval of at least phase three, wherein the measurement circuit applies a measurement signal to the input within the second time interval but not during the first time interval;

a sampling circuit, such as for example circuit 78, having a variable impedance circuit, such as for example circuit 58, configured to selectively couple the sampling circuit to receive the input signal and to selectively increase an impedance of the variable impedance circuit to form a compensation signal, such as for example the signal formed by transistor 69, that is representative of the input signal wherein the sampling circuit forms the compensation signal while the regulation circuit is regulating the input to the first value and is decoupled from receiving the input signal in response to the regulation circuit being decoupled from regulating the input; and the sampling circuit configured to selectively apply, such as for example selectively in response to switches 55 and 65, the compensation signal to the input for at least a portion of the second time interval wherein the measurement circuit applies a measurement signal to be measured to the input for the portion of the second time interval.

An embodiment of the regulation circuit may include an amplifier, such as for example amplifier 46, coupled to receive the input signal and form an output signal on an output of the amplifier wherein the first switch is configured to couple the output of the amplifier to the input.

In an embodiment, the sampling circuit may store a signal from the variable impedance circuit on a first capacitor, such as for example capacitor 59, to form the compensation signal.

The variable impedance circuit may have an embodiment that may be configured to increase the impedance by increasing a resistance of the variable impedance circuit over a plurality of periods of the input signal.

The variable impedance circuit may have an embodiment that may include an MOS transistor configured to increase an on-resistance of the MOS transistor over the plurality of periods of the input signal.

The variable impedance circuit may have an embodiment that may increase the resistance over at least five periods of the input signal.

The variable impedance circuit may have an embodiment that increases the resistance over a time of between approximately five microseconds to approximately ten microseconds.

An embodiment of the sampling circuit may be configured to form the compensation signal during a latter portion of the first time interval and to apply the compensation signal to the input during a latter portion of the second time interval.

The sampling circuit may have an embodiment that may be configured to store the input signal on a first capacitor, such as for example capacitor 59, as the compensation signal during the latter portion of the first time interval and to selectively transfer the compensation signal from the first capacitor to a second capacitor, such as for example capacitor 67, during an early portion of the second time interval wherein the early portion of the second time interval occurs prior to the latter portion of the second time interval.

An embodiment of the measurement circuit may be configured to apply the measurement signal to the input during the latter portion of the second time interval.

Those skilled in the art will also include that an example of a portion of an embodiment of a measurement circuit may comprise:

a measurement channel circuit configured to receive an input signal from an input of the measurement circuit and measure a value of the input signal;

a regulation circuit configured to regulate the input to a first value during a first time interval and to selectively not regulate the input to the first value during a second time interval;

a sampling circuit, such as for example circuit 78, configured to form an average value of the input signal over a plurality of cycles of the input signal wherein the sampling circuit forms the average value over at least a portion of the first time interval while the regulation circuit is regulating the input to the first value; and an output circuit, such as for example the circuit that includes switch 65 and transistor 69, of the sampling circuit configured to apply a signal that is representative of the average value to the input during a portion of the second time interval.

An embodiment may include that the sampling circuit may terminate forming the average value in response to the second time interval.

In an embodiment, the input signal received on the input maybe a signal from a photo-diode that receives ambient light during the first time interval and receives light from an LED during the portion of the second time interval.

The sampling circuit may have an embodiment that may include a variable impedance circuit that receives the input signal and varies an impedance of the variable impedance circuit over the portion of the first time interval to reduce a cut-off frequency of a filter.

An embodiment of the variable impedance circuit may be configured to increase an on-resistance of an MOS transistor over the portion of the first time interval.

In an embodiment, the sampling circuit may include a capacitor coupled to the variable impedance circuit to store an output of the variable impedance circuit as the average value.

The sampling circuit may have an embodiment that is configured to store the average value on a first capacitor during the portion of the first time interval and to transfer the average value to a second capacitor during the second time interval and prior to the portion of the second time interval.

Those skilled in the art will appreciate that an example of an embodiment of a method of forming a compensation circuit may comprise:

configuring the compensation circuit to receive, from an input (such as for example input 14), a first signal (such as for example from LED 12 through diode 13) to be measured;

configuring the compensation circuit to regulate the input to a first value, such as for example the Ref. value, for a first time interval while not receiving the first signal and to receive an input signal, such as for example disturbances from ambient light, for the first time interval;

configuring the compensation circuit to filter, such as for example through circuit 58 and capacitor 59, the input signal to form a sample signal, such as for example the signal applied to capacitor 59, in response to decreasing a cut-off frequency of a filter circuit, such as for example circuit 58 and capacitor 59, from a first cut-off frequency to a second cut-off frequency over a portion, such as for example the phase two time interval, of the first time interval; and configuring the compensation circuit to cease regulating the input to the first value, such as for example opening switch 48, and to apply a signal, such as for example from capacitor 67, that is representative of the sample signal to the input for a second time interval wherein during at least a portion of the second time interval the compensation circuit is not regulating the input to the first value and the first signal is formed at the input thereby removing the sample signal from the first signal to form a compensated first signal.

An embodiment of the method may include configuring the compensation circuit to receive, from the input, includes configuring the compensation circuit to receive the first signal from the input of the compensation circuit; and configuring a measurement channel circuit to measure the compensated first signal.

The method may have an embodiment that includes configuring the compensation circuit to decrease the cut-off frequency to form the sample signal as an average value of the input signal.

In view of all of the above, it is evident that a novel device and method is disclosed. Included, among other features, is forming a compensation circuit to store an average value of disturbances and optionally other variations received while the circuit is not receiving a signal to be measured, and to subtract the stored signal from the signal to be measured thereby improving the accuracy of the measured signal. An embodiment may include that the compensation circuit assists in reducing the dynamic range over which circuit 21 has to operate. Connecting the compensation circuit to the same node that receives the measurement signal (therefore substantially in parallel to the measurement channel circuit) increases the dynamic range of the measurement channel circuit. Forming the regulation circuit substantially in parallel to the sampling circuit allows forming the compensation circuit to reduce the cut-off frequency of the filter and maintain a stable regulation loop for regulator circuit 77. Forming the compensation to gradually lower the cutoff frequency facilitates forming the average value of the input signal.

While the subject matter of the descriptions is described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of system 10 and circuit 45 are used as a vehicle to explain the operational method of forming the compensation circuit substantially in parallel with the measurement circuit and forming the compensation circuit that reduces the cut-off frequency while maintaining a stable regulation loop. Additionally, the fast and stable regulation loop assists in reducing the effects of EMI on the operation of circuit 45. Those skilled in the art will appreciate that other circuit configurations can be used as long as the regulation circuit is substantially in parallel with the sampling circuit, and the compensation circuit varies the cutoff frequency of the filter over a plurality of periods of the input signal.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A measurement circuit comprising:
a measurement channel circuit configured to receive an input signal from an input of the measurement circuit and measure a value of the input signal;
a regulation circuit having a first switch configured to selectively couple the regulation circuit to regulate the input to a first value during a first time interval and to selectively decouple the regulation circuit from regulating the input during a second time interval wherein the measurement circuit receives a measurement signal at the input within the second time interval but not during the first time interval;
a sampling circuit having a variable impedance circuit configured to selectively couple the sampling circuit to receive the input signal and to selectively increase an impedance of the variable impedance circuit to form a compensation signal that is representative of the input signal wherein the sampling circuit forms the compensation signal while the regulation circuit is regulating the input to the first value and wherein the sampling circuit is decoupled from receiving the input signal in response to the regulation circuit being decoupled from regulating the input; and
the sampling circuit configured to selectively apply the compensation signal to the input for at least a portion of the second time interval wherein the measurement circuit receives the measurement signal to be measured at the input for the portion of the second time interval.

2. The measurement circuit of claim 1 wherein the regulation circuit includes an amplifier coupled to receive the input signal and form an output signal on an output of the amplifier wherein the first switch is configured to couple the output of the amplifier to the input.

3. The measurement circuit of claim 1 wherein the sampling circuit stores a signal from the variable impedance circuit on a first capacitor to form the compensation signal.

4. The measurement circuit of claim 1 wherein the variable impedance circuit is configured to increase the impedance by increasing a resistance of the variable impedance circuit over a plurality of periods of the input signal.

5. The measurement circuit of claim 4 wherein the variable impedance circuit is an MOS transistor configured to increase an on-resistance of the MOS transistor over the plurality of periods of the input signal.

6. The measurement circuit of claim 4 wherein the variable impedance circuit increases the resistance over at least five periods of the input signal.

7. The measurement circuit of claim 4 wherein the variable impedance circuit increases the resistance over a time of between approximately five microseconds to approximately ten microseconds.

8. The measurement circuit of claim 1 wherein the sampling circuit is configured to form the compensation signal during a latter portion of the first time interval and to apply the compensation signal to the input during a latter portion of the second time interval.

9. The measurement circuit of claim 8 wherein the sampling circuit is configured to store the input signal on a first capacitor as the compensation signal during the latter portion of the first time interval and to selectively transfer the compensation signal from the first capacitor to a second capacitor during an early portion of the second time interval wherein the early portion of the second time interval occurs prior to the latter portion of the second time interval.

10. The measurement circuit of claim 8 wherein the measurement circuit applies the measurement signal to the input during the latter portion of the second time interval.

11. A measurement circuit comprising:
a measurement channel circuit configured to receive an input signal from an input of the measurement circuit and measure a value of the input signal;
a regulation circuit configured to regulate the input to a first value during a first time interval and to selectively not regulate the input to the first value during a second time interval;
a sampling circuit configured to form substantially an average value of the input signal over a plurality of cycles of the input signal wherein the sampling circuit forms substantially the average value over at least a portion of the first time interval while the regulation circuit is regulating the input to the first value; and
an output circuit of the sampling circuit configured to apply a first signal that is representative of substantially the average value to the input during a portion of the second time interval, the output circuit configured to decouple the input from receiving the first signal during the first time interval.

12. The measurement circuit of claim 11 wherein the sampling circuit terminates forming the average value in response to the second time interval.

13. The measurement circuit of claim 11 wherein the input signal received on the input is a signal from a photo-diode that receives ambient light during the first time interval and receives light from an LED during the portion of the second time interval.

14. The measurement circuit of claim 11 wherein the sampling circuit includes a variable impedance circuit that receives the input signal and varies an impedance of the variable impedance circuit over the portion of the first time interval to reduce a cut-off frequency of a filter.

15. The measurement circuit of claim 14 wherein the variable impedance circuit is configured to increase an on-resistance of an MOS transistor over the portion of the first time interval.

16. The measurement circuit of claim 14 wherein the sampling circuit includes a capacitor coupled to the variable impedance circuit to store an output of the variable impedance circuit as the average value.

17. The measurement circuit of claim 11 wherein the sampling circuit is configured to store the substantially average value on a first capacitor during the portion of the first time interval and configured to transfer substantially the average value to a second capacitor during the second time interval and prior to the portion of the second time interval.

18. A method of forming a compensation circuit comprising:
   configuring the compensation circuit to receive, from an input, a first signal to be measured;
   configuring the compensation circuit to regulate the input to a first value for a first time interval while not receiving the first signal and to receive an input signal for the first time interval;
   configuring the compensation circuit to filter the input signal to form a sample signal in response to decreasing a cut-off frequency of a filter circuit from a first cut-off frequency to a second cut-off frequency over a portion of the first time interval; and
   configuring the compensation circuit to cease regulating the input to the first value and to apply a signal that is representative of the sample signal to the input for a second time interval wherein during at least a portion of the second time interval the compensation circuit is not regulating the input to the first value and the first signal is formed at the input thereby removing the sample signal from the first signal to form a compensated first signal.

19. The method of claim 18 wherein configuring the compensation circuit to receive, from the input, includes configuring the compensation circuit to receive the first signal from the input of the compensation circuit; and
   configuring a measurement channel circuit to measure the compensated first signal.

20. The method of claim 18 including configuring the compensation circuit to decrease the cut-off frequency to form the sample signal as an average value of the input signal.

* * * * *